United States Patent
Ding et al.

(10) Patent No.: US 9,773,528 B1
(45) Date of Patent: Sep. 26, 2017

(54) SOCKET WITH BRANCHING POINT

(71) Applicant: QUALCOMM Incorporated, San Diego, CA (US)

(72) Inventors: Chong Ding, Cary, NC (US); Douglas Bruce White, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/141,650

(22) Filed: Apr. 28, 2016

(51) Int. Cl.
| | |
|---|---|
| *G11C 5/06* | (2006.01) |
| *H05K 1/02* | (2006.01) |
| *H01R 12/73* | (2011.01) |

(52) U.S. Cl.
CPC ............ *G11C 5/06* (2013.01); *H01R 12/735* (2013.01); *H05K 1/0296* (2013.01); *H05K 2201/10159* (2013.01)

(58) Field of Classification Search
CPC ....... G11C 5/06; H01R 12/735; H05K 1/0296
See application file for complete search history.

(56) References Cited

U.S. PATENT DOCUMENTS

| | | | |
|---|---|---|---|
| 6,356,959 B1 | 3/2002 | Thomas et al. | |
| 6,833,618 B2 | 12/2004 | Ono et al. | |
| 7,072,201 B2 * | 7/2006 | So | G11C 5/063 365/51 |
| 7,522,421 B2 | 4/2009 | Roper et al. | |
| 7,646,212 B2 * | 1/2010 | Sung | G11C 5/04 326/30 |
| 8,274,850 B2 * | 9/2012 | Koshizuka | G11C 5/04 326/30 |
| 8,866,023 B2 | 10/2014 | Kadri et al. | |
| 8,873,249 B2 | 10/2014 | Bandholz et al. | |
| 9,086,874 B2 | 7/2015 | Johnson et al. | |
| 2009/0007048 A1 | 1/2009 | Cases et al. | |

OTHER PUBLICATIONS

International Search Report and Written Opinion—PCT/US2017/026448—ISA/EPO—dated Jul. 11, 2017.

* cited by examiner

*Primary Examiner* — Tri Hoang
(74) *Attorney, Agent, or Firm* — Arent Fox, LLP

(57) ABSTRACT

An apparatus includes a memory module socket having a base end and a branching point. The base end is coupled to a printed circuit board (PCB). The branching point is external to the PCB. A first branch extends from the branching point at an angle $\theta 1$, where 90 degrees$\leq \theta 1 <$180 degrees, and a second branch extends from the branching point at an angle $\theta 2$, where 90 degrees$\leq \theta 2 <$180 degrees. A method includes signaling between the PCB and a first memory module and a second memory module via a base end of the memory module socket. The memory module socket connects to the PCB via the base end. The signaling is branched at a branching point of the memory module socket to the first memory module via a first branch and to the second memory module via a second branch. The branching is external to the PCB.

28 Claims, 9 Drawing Sheets

SOCKET WITH BRANCHING POINT

BACKGROUND

Field

The present disclosure relates generally to sockets configured to receive memory modules, and more particularly, to a socket with a branching point to receive memory modules.

Background

Memory is a vital component for computing in general and for wireless communication in particular. Memory modules (e.g., dual-inline memory modules (DIMMs)) may be connected to a circuit board (e.g., a printed circuit board (PCB)) via memory module sockets (sockets hereinafter). The socket may be configured to physically receive (e.g., mate with) the memory modules and electrically connect the memory modules to components on the PCB. For example, a processor (e.g., central processing unit (CPU)) may be mounted on the PCB and electrically communicate with the memory modules via the socket. In other words, signaling between the processor and the memory modules is conducted through the socket.

With the ever increasing demands for more performance, one design challenge is to improve the speed of the signaling between the processor and the memory modules.

SUMMARY

Aspects of an apparatus are disclosed. The apparatus includes a memory module socket having a base end and a branching point. The base end is coupled to a PCB. The branching point is external to the PCB. A first branch extends from the branching point at an angle θ1, where 90 degrees≤θ1<180 degrees, and a second branch extends from the branching point at an angle θ2, where 90 degrees≤θ2<180 degrees.

Aspects of a method for signaling between one or more memory modules and a PCB via a memory module socket are disclosed. The method includes signaling between the PCB and a first memory module and a second memory module via a base end of the memory module socket. The memory module socket connects to the PCB via the base end. The method further includes branching the signaling at a branching point of the memory module socket to the first memory module via a first branch and to the second memory module via a second branch. The branching is external to the PCB. The first branch extends from the branching point at an angle θ1, where 90 degrees≤θ1<180 degrees, and the second branch extending from the branching point at an angle θ2, where 90 degrees≤θ2<180 degrees.

Further aspects of an apparatus are disclosed. The memory includes a memory module socket having means for connecting the memory module socket to a PCB and means for branching a first branch and a second branch. The means for branching is external to the PCB. The base end is coupled to a PCB. The branching point is external to the PCB. A first branch extends from the branching point at an angle θ1, where 90 degrees≤θ1<180 degrees, and a second branch extends from the branching point at an angle θ2, where 90 degrees≤θ2<180 degrees.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1A:
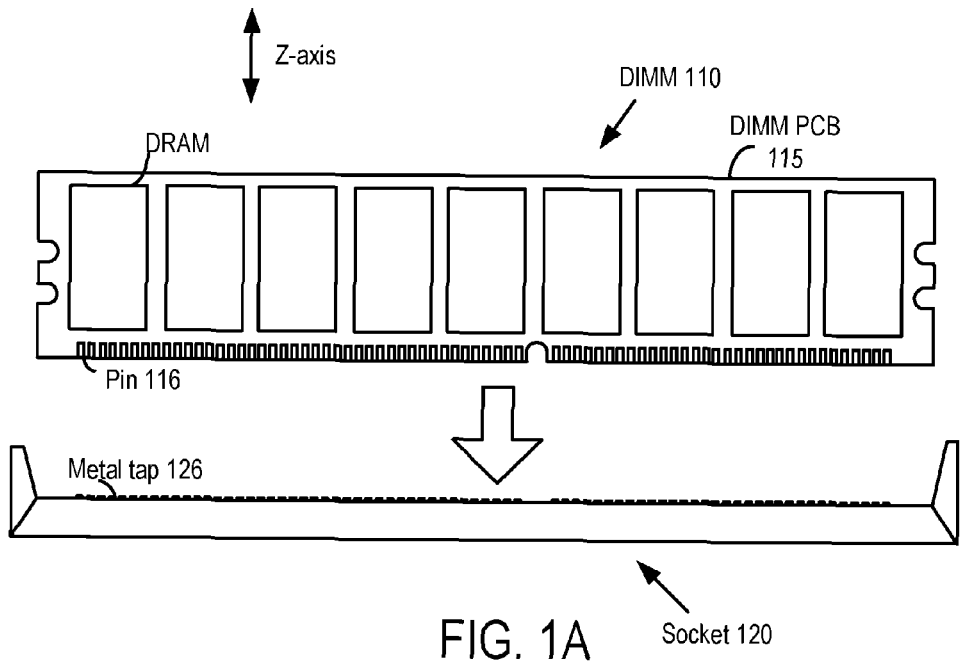
FIG. 1A is a diagram of an exemplary embodiment of a DIMM and a socket.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of sockets to receive memory modules will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

The various sockets to receive memory modules presented throughout this disclosure may be incorporated within various apparatuses. By way of example, the disclosed sockets may be implemented as stand-alone apparatuses. The sockets may also be included in any system, or any portion of a system, or any intermediate product (e.g., a video card, a motherboard, etc.), or any end product (e.g., mobile phone, personal digital assistant (PDA), personal computer (PC), laptop computer, palm-sized computer, tablet computer, work station, game console, media player, computer based simulators, server, wireless communication attachments for laptops, or the like). Various aspects of methods disclosed herein shall similarly be implemented in a stand-alone socket or included in any system, or any portion of a system, or any intermediate product or end product, or any step, process, algorithm, or the like, or any combination thereof performed by such stand-alone socket, system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof.

Various aspects of sockets to receive memory modules will now be presented in the context of sockets that physically receive DIMMs and electrically connects the DIMMs to other components. However, as those skilled in the art will readily appreciate, such aspects may be extended to other types of memory modules. Accordingly, all references to the sockets are intended only to illustrate exemplary aspects of the sockets with the understanding that such aspects may be extended to a wide range of applications.

The various aspects of the sockets may be presented in reference to x-axis, y-axis, and z-axis that are orthogonal to each other. For example, the x-y plane may correspond to a horizontal plane, and the z-axis may be the vertical direction in reference to the x-y plane.

FIG. 1A is a diagram of an exemplary embodiment of a DIMM and a socket. The diagram 100 includes a DIMM 110 and a socket 120. The DIMM 110 may be inserted into the socket 120 in the z-axis direction. The DIMM 110 may include a DIMM PCB 115 with memories (e.g., DRAMs) on both sides of the DIMM PCB 115. The sides of the DIMM PCB 115 are referenced as the top and the bottom. The top side of the DIMM PCB 115 may have m DRAMs attached thereon, and the bottom side of the DIMM PCB 115 may have n DRAMs (which may differ from the number m) attached thereon. The DIMM 110 further includes pins 116 electrically connected to the DRAMs. The socket 120 may include a slot to physically receive the DIMM 110 (the slot is not seen in the this view). The socket 120 may further include various metal taps 126 that, when the DIMM 110 is mated with the socket 120, electrically connect to the pins 116 of the DIMM 110.

Figure 1B:
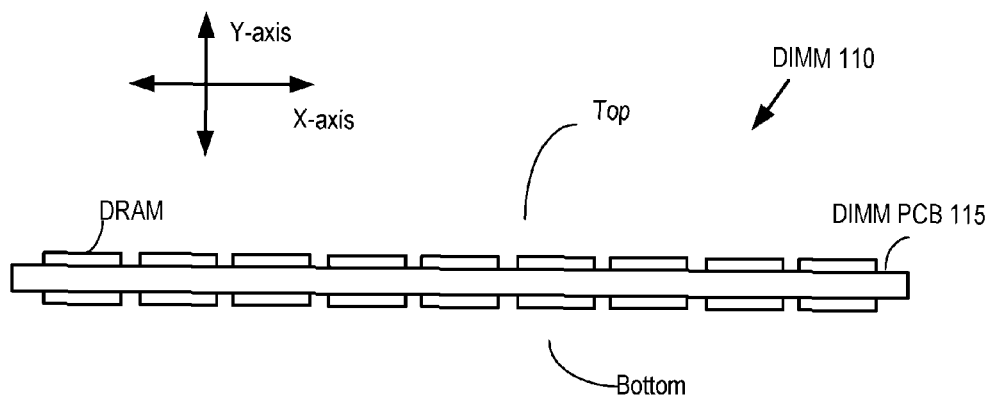
FIG. 1B is a diagram of the DIMM of FIG. 1A as viewed in the z-axis.

FIG. 1B is a diagram of the DIMM of FIG. 1A as viewed in the z-axis. The diagram 101 illustrates that the DIMM 110 has two sides, referred to as the top side and the bottom side. As illustrated, each of the top and bottom sides includes nine DRAMs attached thereon (e.g., m equals n).

Figure 2:
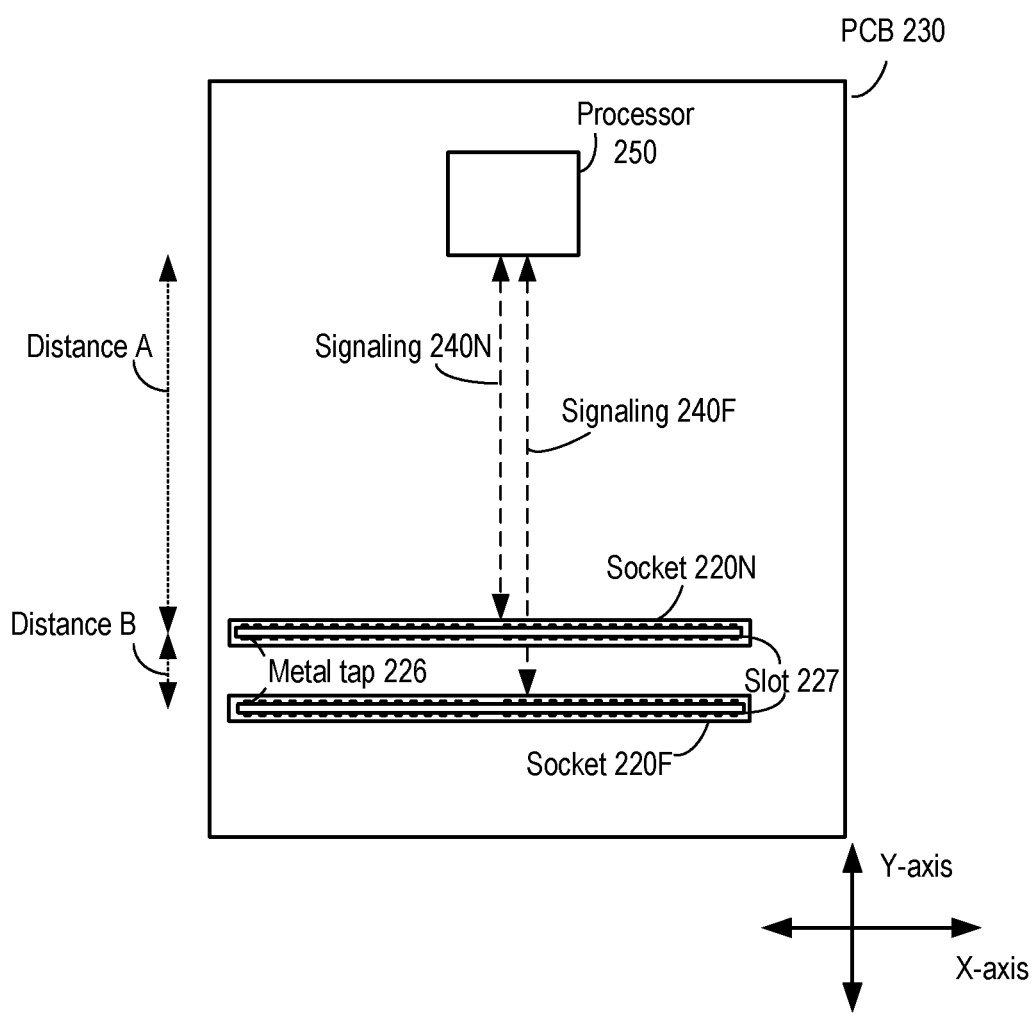
FIG. 2 is diagram of an exemplary embodiment of a PCB with a processor and sockets of FIG. 1A.

FIG. 2 is diagram of an exemplary embodiment of a PCB with a processor and sockets of FIG. 1A. The diagram 200 includes the PCB 230. The PCB 230 may be, for example, a motherboard for a PC or server, or an attachment card such as a video card. The PCB 230 may include a processor 250 (e.g., central processing unit or CPU) and sockets 220N and 220F (e.g., instances of the socket 120 of FIG. 1A). Each of the sockets 220N and 220F includes a slot 227 to physically receive the DIMM 110. Metal taps 226 connect respectively to the pins 116 of the DIMM 110 when the DIMM 110 is mated with the socket 220N or 220F.

The processor 250 may communicate with the socket 220N via the signaling 240N and communicate with the socket 220F via the signaling 240F. The signaling 240N and the signaling 240F may be carried by conductive, connection traces within the PCB 230 (traces or connection traces hereinafter) and may travel different distances. For example, the signaling 240N travels distance A, and the signaling 240F travels distance A and distance B. Certain issues, presented with FIG. 3 below, may arise due to the different distances traveled by the signaling 240N and the signaling 240F.

Figure 3:
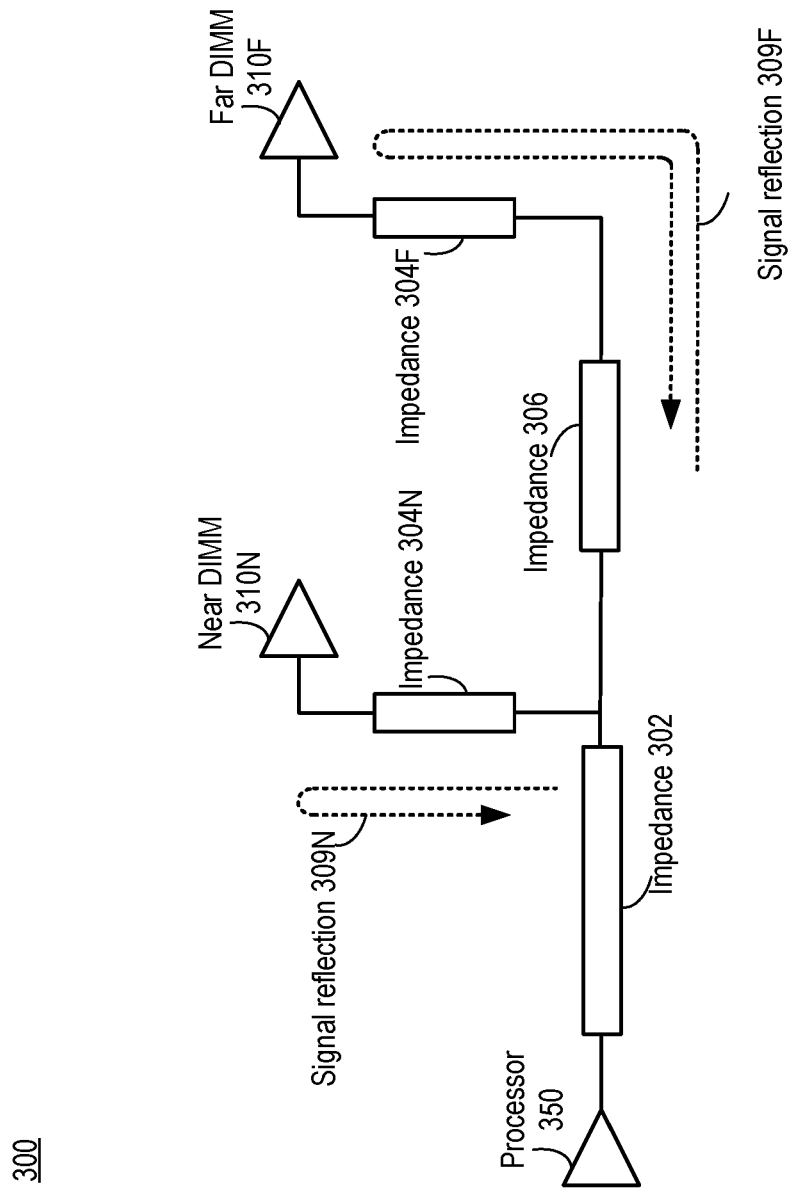
FIG. 3 is a conceptual diagram of signal reflections of the components of FIG. 2.

FIG. 3 is a conceptual diagram of signal reflections of the components of FIG. 2. The diagram 300 includes the processor 350 (e.g., an instance of the processor 250 of FIG. 2) communicating with DIMMs 310N and 310F (e.g., instances of the DIMM 110 of FIG. 1A) via, respectively, the sockets 220N and 220F of FIG. 2. The diagram 300 includes impedances 302, 304N, 304F, and 306. The impedance 302 may correspond to a trace of the length of distance A. The impedance 304N may correspond to the impedance of the socket 220N, including the traces within the DIMM PCB of the DIMM 310N (e.g., traces within the DIMM PCB 115 connecting the pins 116 to the DRAMs). The impedance 304F may correspond to the impedance of the socket 220F including the traces within the DIMM 310F. The impedance 304N and the impedance 304F may be substantially the same, due to the DIMMs 310N and 310F being the same type of DIMM. The impedance 306 may correspond to a trace of the length of distance B.

The signaling between the processor 350 and the DIMM 310N and the signaling between the processor 350 and the DIMM 310F are subject to different signal reflections, due to the different impedances. For example, the signaling between the processor 350 and the DIMM 310N passes through the impedance 302 (impedance of a trace of a length of distance A) and the impedance 304N. The signaling between the processor 350 and the DIMM 310F passes through the impedance 302 (impedance of a trace of a length of distance A), the impedance 304F, and, in addition, the impedance 306 (impedance of a trace of a length of distance B). As a result, the signal reflection 309N (of the signaling between the processor 350 and the DIMM 310N) differs from the signal reflection 309F (signaling between the processor 350 and the DIMM 310F). The system of diagram 300 generally cannot account for the different signal reflections. For example, the processor 350 may drive the signaling to the DIMM 310F and the DIMM 310N with the same drive strength. As a result, the signal reflection 309N may duffer from the signal reflection 309F, due the difference in impedances. The signal integrity may degrade as a result, limiting the speed to access the DIMMs 310N and 310F.

Figure 4A:
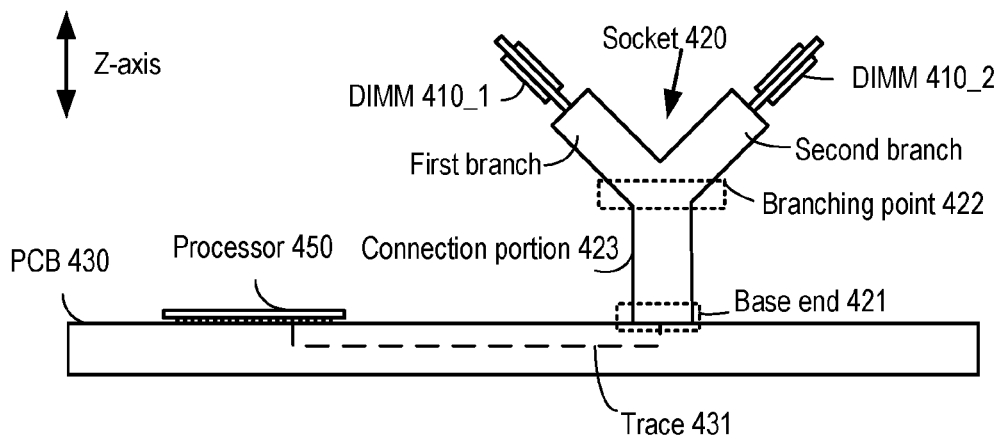
FIG. 4A is a diagram of an exemplary embodiment of a socket with a branching point to receive DIMMs.

FIG. 4A is a diagram of an exemplary embodiment of a socket with a branching point to receive DIMMs. The diagram 400 includes a PCB 430. A processor (e.g., CPU) 450 is attached and electrically connected to the PCB 430. A socket 420 (e.g., memory module socket) is configured to physically receive DIMMs. The socket 420 includes a base end 421 configured to couple (e.g., to physically attach and/or electrically connect) to the PCB 430. The processor 450 may be electrically connected to the socket 420 (e.g., at the base end 421) via connection traces 431.

The socket 420 further includes a branching point 422 external to the PCB 430 (e.g., the PCB 430 may be on the x-y plane and the branching point 422 may be external to the PCB 430 in the z-axis). The socket 420 includes a connection portion 423 extending the z-axis connecting the base end 421 and the branching point 422. The socket 420 includes a first branch and a second branch branched at the branching point 422. Each of the first branch and the second branch is configured to physically receive and electrically connect to a DIMM. In the diagram 400, the DIMM 410_1 is attached and/or electrically connected to the first branch, and the DIMM 410_2 is physically attached and/or electrically connected to the second branch. The DIMMs 410_1 and 410_2 may be instances of the DIMM 110 of FIG. 1A.

Figure 4B:
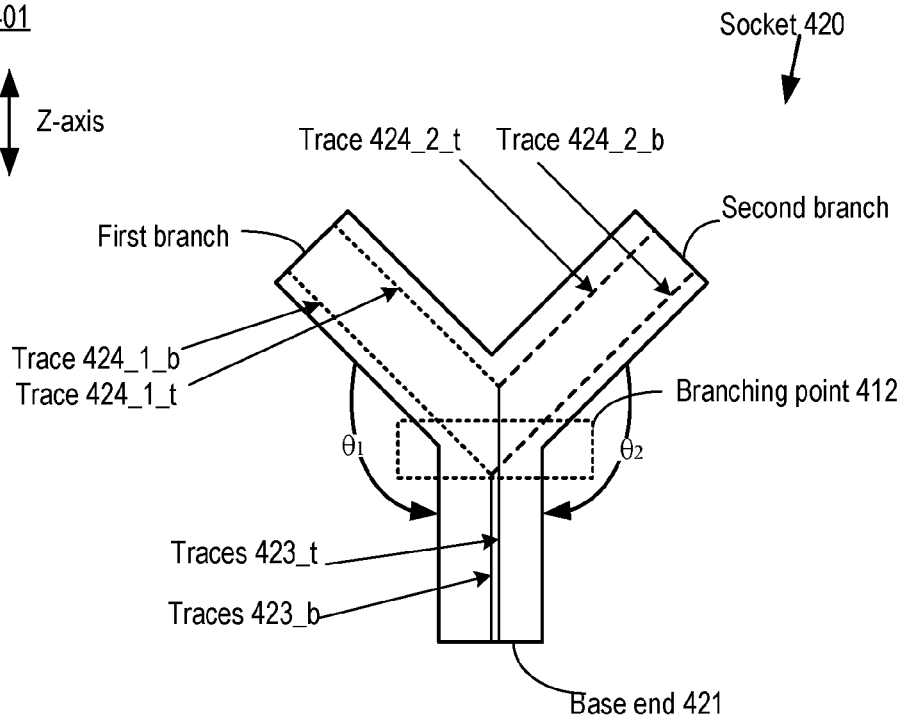
FIG. 4B is diagram of another view of the socket of FIG. 4A with connection traces.

FIG. 4B is diagram of another view of the socket of FIG. 4A with conductive traces. The diagram 401 illustrates that the first branch extending from the branching point 412 at an angle θ1. In some examples, the angle θ1 is 90 degrees≤θ1<180 degrees. The second branch extends from the branching point 412 at an angle θ2. In some examples, the angle θ2 is 90 degrees≤θ2<180 degrees. The angles θ1 and/or θ2 may be, for example, angles extending from the z-axis to the first and second branches. The angles θ1 and/or θ2 are not necessarily the same. Thus, the first branch (and/or the second branch) may extend from the branching point 412 at a right angle (90 degrees) or almost vertical (almost 180 degrees). In some examples, the first branch or the second branch are straight (e.g., without a bending point therein). That is, for example, all portions of the first branch are at the angle θ1 to the branching point 412, and all portions of the second branch are at the angle θ2 to the branching point 412.

The socket 420 includes conductive, connection traces that electrically connect the pins of the attached DIMMs 410_1 and 410_2 to the base end 421 and to components electrically connected to the PCB 430 (e.g., processor 450). For example, the pins of the DIMM 410_1 are connected to the base end via traces 424_1 (e.g., traces 424_1_t and 424_1_b) and traces 423 (e.g. traces 423_t and 423_b). The pins at the top side of the DIMM 410_1 may be connected to the base end 421 via traces 424_1_t and 423_t. The pins at the bottom side of the DIMM 410_1 may be connected to the base end 421 via traces 424_1_b and 423_b. The pins at the top side of the DIMM 410_2 may be connected to the base end 421 via traces 424_2_t and 423_t. The pins at the bottom side of the DIMM 410_2 may be connected to the base end 421 via traces 424_2_b and 423_b.

The impedances of the traces from the base end 421 to the DIMM 410_1 and the DIMM 410_2 are equal or substantially equal. For example, the traces 424_1 and 423 are substantially the same or the same length as the traces 424_2 and 423. Signal reflections of the DIMM 410_1 and the DIMM 410_2 are presented in further detail with FIG. 6.

Figure 5:
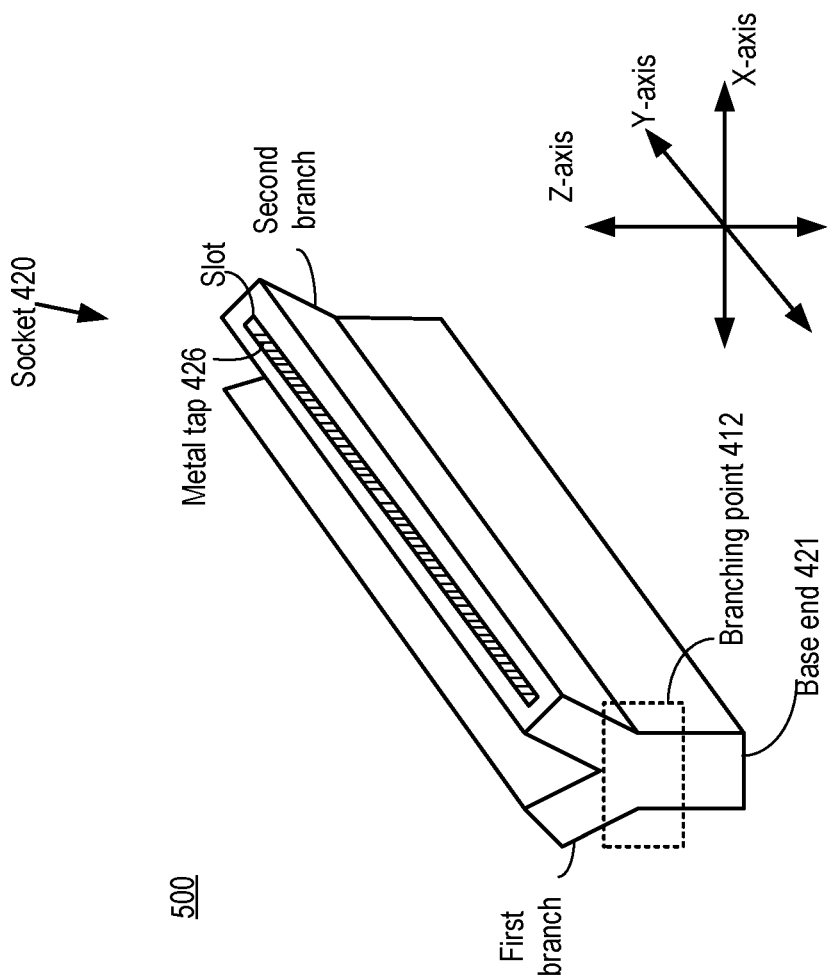
FIG. 5 is a diagram of a perspective view of the socket of FIG. 4A.

FIG. 5 is a diagram of a perspective view of the socket of FIG. 4A. The diagram 500 illustrates that the socket 420 rising above the base end 421 (and therefore a PCB connected thereto) in the z-axis. Each of the first branch and the second branch may include a slot and various metal taps 426. The first branch and the second branch extend from the branching point 412. The slot allows the DIMM 410_1 and/or 410_2 to be inserted, and the metal taps 426 to be electrically connected to the pins 116 of the DIMM 410_1 and/or 410_2.

Figure 6:
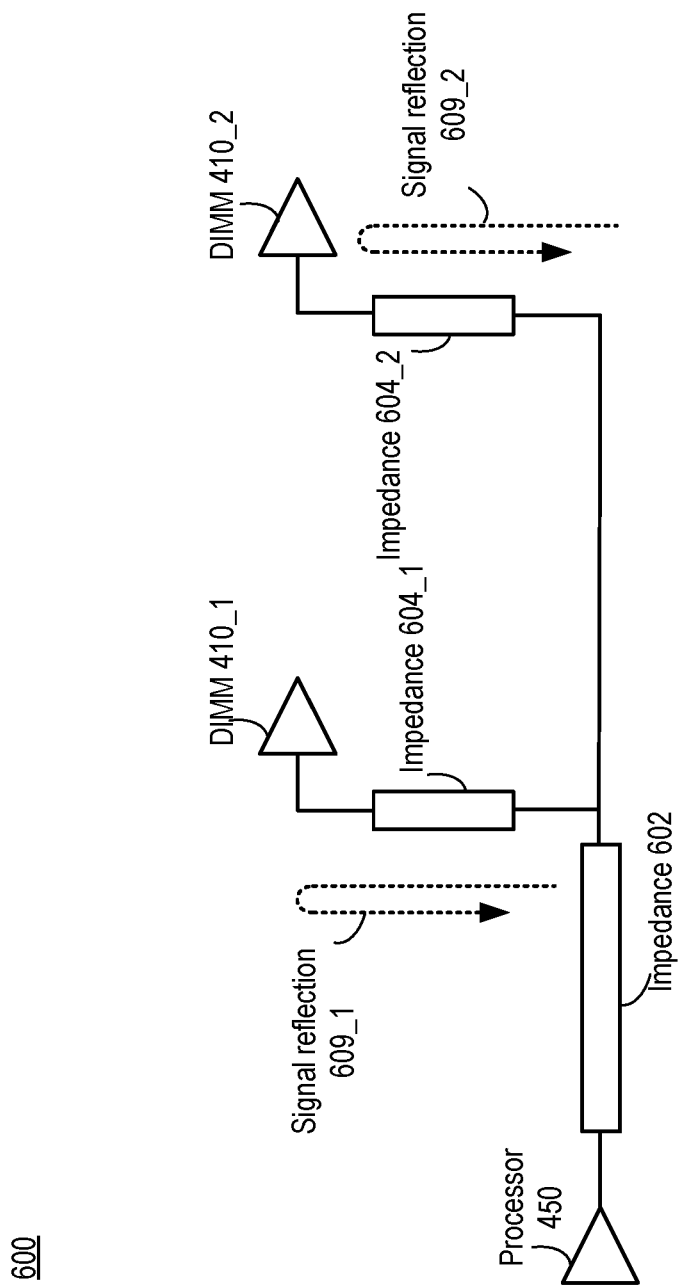
FIG. 6 is a conceptual diagram of signal reflections of the components of FIG. 4A.

FIG. 6 is a conceptual diagram of signal reflections of the components of FIG. 4A. The diagram 600 includes the processor 450 (e.g., an instance of the processor 250 of FIG. 2) communicating with DIMMs 410_1 and 410_2 (e.g., instances of the DIMM 110 of FIG. 1A) via, respectively, the socket 420 of FIG. 4A. The diagram 600 includes impedances 602, 604_1, and 604_2. The impedance 602 may correspond to the trace 431 of FIG. 4A. The impedance 604_1 may correspond to the impedance of the socket 420 and the traces within the DIMM PCB of the DIMM 410_1 (e.g., traces within the DIMM PCB 115 connecting the pins 116 to the DRAMs). The impedance 604_2 may correspond to the impedance of the socket 420 and the traces within the DIMM 410_2. The impedance 604_1 and the impedance 604_2 may be substantially the same, due to the DIMMs 410_1 and 410_2 being the same type of DIMMs. Moreover, within the socket 420, the traces connecting to the pins of the DIMM 410_1 (e.g., traces 424_1 and traces 423) and the traces connecting to the pins of the DIMM 410_2 (e.g., traces 424_2 and traces 423) are the same or substantially the same, as presented with FIG. 4B.

Accordingly, the signaling between the processor 450 and the DIMM 410_1 and the signaling between the processor 450 and the DIMM 410_2 travel through the same or substantially the same impedances. That is, the impedance 602 plus the impedance 604_1 (for the signaling between the processor 450 and the DIMM 410_1) and the impedance 602 plus the 604_2 (for the signaling between the processor 450 and the DIMM 410_2) are the same or substantially the same as presented above. As a result, the signal reflection 609_1 of the signaling between the processor 450 and the DIMM 410_1 and the signal reflection 609_2 of the signaling between the processor 450 and the DIMM 410_2 are the same or substantially the same.

The system of the diagram 600 (e.g., the drive strength of the processor 450) may account for the same or substantially the same signal reflections 609_1 and 609_2. As a result, the signal integrity does not degrade, and the speed of the signaling between the processor 450 and the DIMMs 410_1 and/or 410_2 may be improved.

Referring to FIGS. 4A, 4B, and 6, in some examples, the memory modules (DIMMs 410_1 and 410_2) are electrically coupled to PCB 430 (e.g., to the trace 431 within the PCB 430) via a single base end 421 of the socket 420. The traces 423, 424_1, and 424_2 provides the means for conducting signaling to the DIMMs 410_1 and 410_2. The signal reflection 609_1 of the DIMM 410-1 and the signal reflection 609_2 of the second one of the plurality of memory modules are substantially the same, as presented with FIG. 6. In some examples, a component on the PCB 430, such as the processor 450, provides the means for providing the signaling (e.g., drives the signals on the traces 423, 424_1, and 424_2) to the DIMMs 410_1 and 410_2 via the single base end connected to the PCB. The drives processor 450 may drive the DIMMs 410_1 and 410_2 at substantially a same strength, due to the signal reflections 609_1 and 609_2 being substantially the same. In such fashion, the processor 450 does not need to customize the drive strengths to provide signals to different memory modules.

Figure 7A:
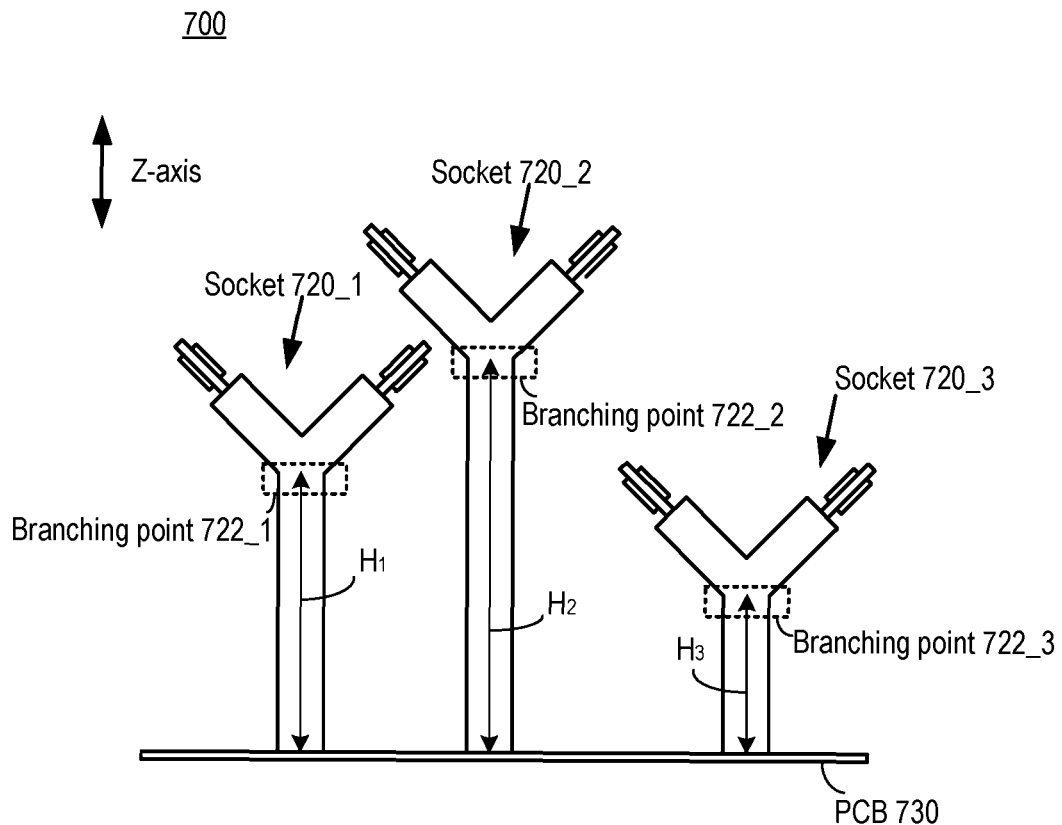
FIG. 7A is a diagram of another exemplary embodiment of the socket of FIG. 4A.

FIG. 7A is a diagram of another exemplary embodiment of the socket of FIG. 4A. The diagram 700 includes a PCB 730 (e.g., an instance of the PCB 430 of FIG. 4A) with multiple sockets 720 (e.g., instances of the socket 420 of FIG. 4A). The PCB 730 are connected to the sockets 720 in the fashion described with FIG. 4A. The sockets 720 may include the branching points 722 of different heights with respect to the PCB 730. For example, the socket 720_1 includes the branching point 722_1 of height $H_1$; the socket 720_2 includes the branching point 722_2 of height $H_2$; and the socket 720_3 includes the branching point 722_3 of height $H_3$. The heights $H_1$, $H_2$, and $H_3$ differ from each other. Due to the different heights, the branches of one socket 720 may be staggered with (e.g., disposed under) the branches of another socket 720. In such fashion, the sockets 720_1, 720_2, and 720_3 may be placed closer to each other to reduce space.

Figure 7B:
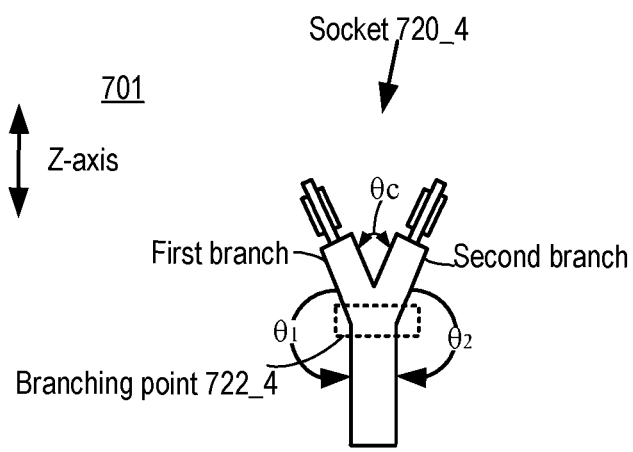
FIG. 7B is a diagram of another exemplary embodiment of the socket of FIG. 4A.

FIG. 7B is a diagram of another exemplary embodiment of the socket of FIG. 4A. The diagram 701 includes the socket 720_4 with branches (first branch and second branch) being close to each other to reduce space. In such fashion, spaces between the multiple sockets 720 may be reduced. In some examples, the angle $\theta_1$ and/or the angle $\theta_2$ are greater or equal to 135 degrees. In other words, the angle $\theta_c$ between the first branch and the second branch may be 90 degrees or less. In some examples, the branches may be as close as would be physically allowed.

Figure 8A:
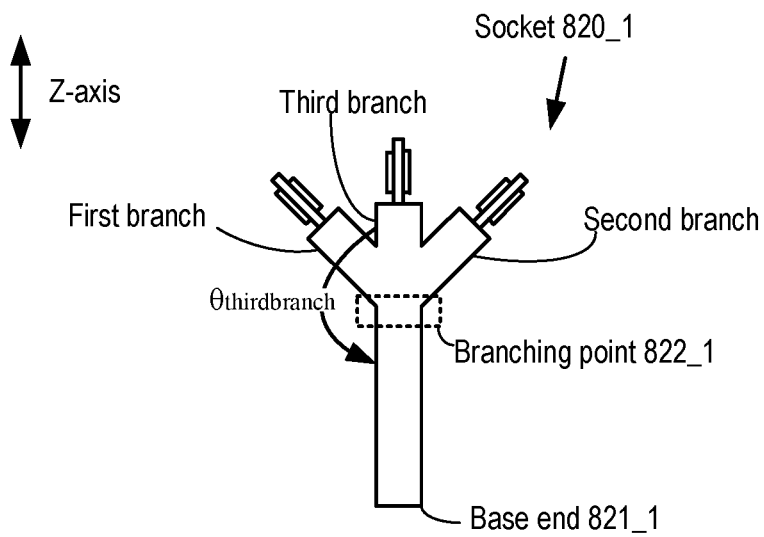
FIG. 8A is a diagram of another exemplary embodiment of the socket of FIG. 4A.

FIG. 8A is a diagram of another exemplary embodiment of the socket of FIG. 4A. The diagram 800 includes a socket 820_1 (e.g., an instance of the socket 420 of FIG. 4A) having more than two branches. In addition to the first branch and the second branch, a third branch extends from the branching point 822_1 at an angle $\theta_{thirdbranch}$. In some examples, the angle $\theta_{thirdbranch}$ is substantially 180 degrees. In other words, the third branch may extend substantially vertically in the z-axis. In such fashion, additional DIMMs may be connected to a single socket 820.

The connection traces within the socket 820_1 connecting the base end 821_1 and each of the DIMMs connecting to the first branch, the second branch, and the third branch are the same or substantially the same length. As a result, the signal reflections of the signaling to each of the DIMMs are substantially the same. Speed of such signaling is improved as described with FIG. 4B.

Figure 8B:
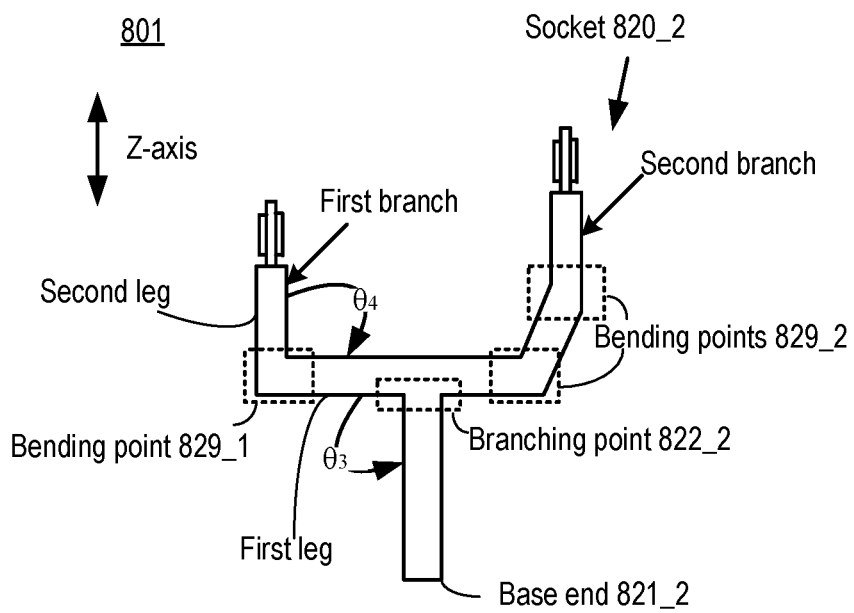
FIG. 8B is a diagram of another exemplary embodiment of the socket of FIG. 4A.

FIG. 8B is a diagram of another exemplary embodiment of the socket of FIG. 4A. The diagram 801 includes a socket 820_2. At least one of the first branch and the second branch of the socket 820_2 includes a bending point 829. Using the first branch as example, the first branch includes a first leg and a second leg connected at a bending point 829_1. The first leg extends from the branching point 822_2 at an angle $\theta_3$, where the angle $\theta_3$ is substantially 90 degrees. In some examples, the angle $\theta_3$ may be an example of angle $\theta_1$ described with FIG. 4B. Further, the angle $\theta_3$ may not be so limited and may be greater than 90 degrees, for example. The second leg extends from the bending point 829_1 at an angle $\theta_4$, where $0<\theta_4\leq180$ degrees. As an example, the second branch includes multiple bending points 829_2. In some examples, both the angles $\theta_3$ and $\theta_4$ may be substantially 90 degrees such that the first branch and the second branch provide the means for physically attaching the memory modules substantially vertical to the PCB 730 (e.g., parallel to the z-axis).

The connection traces within the socket 820_1 connecting the base end 821_2 and each of the DIMMs connecting to the first branch and the second branch are the same or substantially the same length. As a result, the signal reflections of the signaling to each of the DIMMs are substantially the same. Speed of such signaling is improved as described with FIG. 4B.

Figure 9:
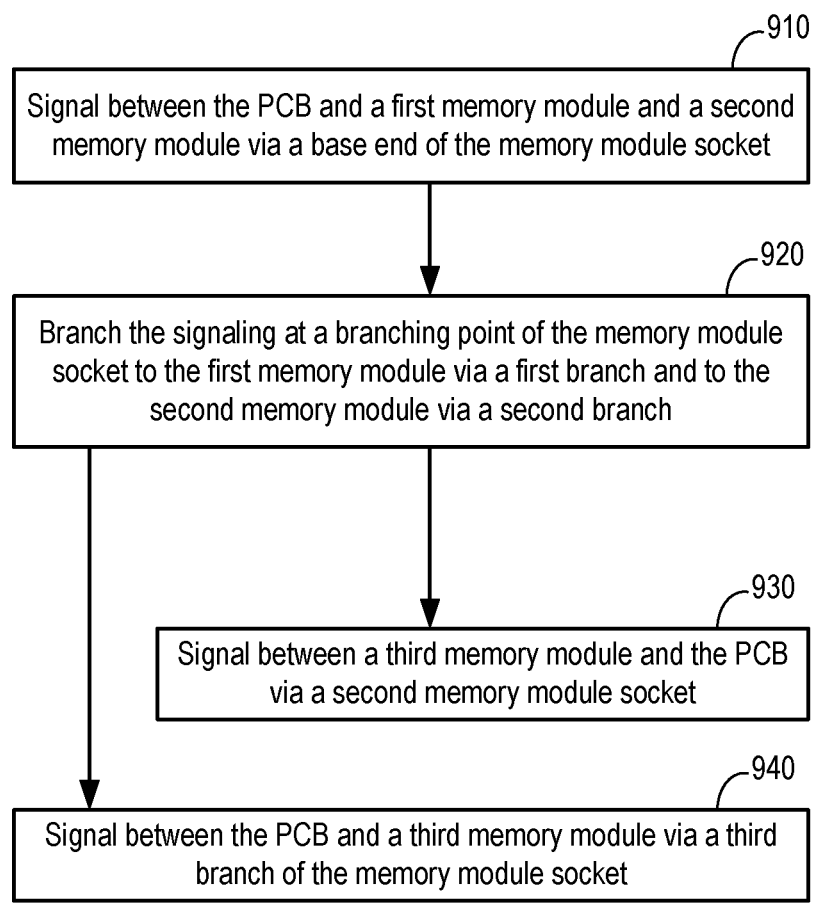
FIG. 9 is a flowchart for operation of the socket of FIG. 4A.

FIG. 9 is a flowchart for operation of the socket of FIG. 4A. The flowchart 900 may be performed by apparatuses described in FIGS. 4A, 4B, 5, 7A, 7B, 8A, and 8B. At 910, the PCB and a first memory module and a second memory module are signaled via a base end of a memory module socket. As an example, the base end 421 provides the means for connecting the socket 420 to the PCB 430. Referring to FIG. 4A, the socket 420 is connected to the PCB 430 via the base end 421. The PCB 430 signals the DIMM 410_1 and the DIMM 410_2 via the socket 420.

At 920, the signaling is branched at a branching point of the memory module socket to the first memory module via a first branch and to the second memory module via a second branch. In some examples, the branching point 412 provides the means for branching the first branch and the second branch of the socket 420. Referring to FIG. 4B, for example, the signaling may be conducted via the connection traces (e.g., traces 423 and 424). The signaling or connection traces are branched at the branching point 412 of the socket 420 to the DIMM 410_1 via the first branch and to the DIMM 410_2 via the second branch.

At 930, a third memory module and the PCB are signaled via a second memory module socket. Referring to FIG. 7A, a PCB 730 (e.g., an instance of the PCB 430 of FIG. 4A) is connected with multiple sockets 720 (e.g., instances of the socket 420 of FIG. 4A). The PCB 730 are connected to the sockets 720 in the fashion described with FIG. 4A. The sockets 720 having the branching points 722 of different heights with respect to the PCB 730. For example, the socket 720_1 includes the branching point 722_1 of height $H_1$. The socket 720_2 includes the branching point 722_2 of height $H_2$. The socket 720_3 includes the branching point 722_3 of height $H_3$. The heights $H_1$, $H_2$, and $H_3$ differ from each other. Due to the different heights, the branches of one socket 720 may be staggered with (e.g., disposed under) the branches of another 720. In such fashion, the sockets 720_1, 720_2, and 720_3 may be placed closer to each other to reduce space.

At 940, the PCB and a third memory module are signaled via a third branch of the memory module socket. Referring to FIG. 8A, The diagram 800 includes a socket 820_1 (e.g., an instance of the socket 420 of FIG. 4A) having more than two branches. In addition to the first branch and the second branch, a third branch extends from the branching point 822_1 at an angle $\theta_{thirdbranch}$. In some examples, the angle $\theta_{thirdbranch}$ is substantially 180 degrees. In other words, the third branch extends substantially vertically in the z-axis. In such fashion, addition DIMMs may be connected to a single socket 820.

The connection traces within the socket 820_1 connecting the base end 821_1 and each of the DIMMs connecting to the first branch, the second branch, and the third branch are the same or substantially the same length. As a result, the signal reflections of the signaling to each of the DIMMs are substantially the same. Speed of such signaling is improved as described with FIG. 4B.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
a memory module socket comprising:
a base end and a branching point, the base end being configured to be coupled to a printed circuit board (PCB), the branching point being configured to be external to the PCB;
a first branch extending from the branching point at an angle $\theta_1$ with respect to the base end, where 90 degrees≤$\theta_1$<180 degrees; and
a second branch extending from the branching point at an angle $\theta_2$ with respect to the base end, where 90 degrees≤$\theta_2$<180 degrees,
wherein the memory module socket substantially forms a Y-shape between the base end and the first branch and the second branch.

2. The apparatus of claim 1, wherein the first branch is configured to connect to a first memory module, and the second branch is configured to connect to a second memory module.

3. The apparatus of claim 2, wherein the memory module socket comprises a first connection trace configured to connect the first memory module at the first branch to the PCB, and a second connection trace configured to connect the second memory module at the second branch to the PCB, wherein the first connection trace and the second connection trace are of substantially a same length.

4. The apparatus of claim 3, wherein the first branch and the second branch are straight.

5. The apparatus of claim 3, wherein one of the first branch and the second branch comprises a first leg and a second leg connected at a bending point.

6. The apparatus of claim 5, wherein the first leg extends from the branching point at an angle $\theta_3$ with respect to the base end, where the angle $\theta_3$ is substantially 90 degrees.

7. The apparatus of claim 6, wherein the second leg extends from the bending point at an angle $\theta_4$ with respect to the bending point, where 0 degrees<$\theta_4$≤180 degrees.

8. The apparatus of claim 2, further comprising a plurality of the memory module sockets having the branching points of different heights with respect to the PCB.

9. The apparatus of claim 2, further comprising a third branch configured to connect to a third memory module, wherein the third branch extends from the branching point at an angle $\theta_{THIRDBRANCH}$ with respect to the base end, where $\theta_{THIRDBRANCH}$ is substantially 180 degrees.

10. A method for signaling between a plurality of memory modules and a printed circuit board (PCB) via a memory module socket, comprising:
signaling between the PCB and a first one and a second one of the plurality of memory modules via a base end of the memory module socket, wherein the memory module socket connects to the PCB via the base end;
branching the signaling at a branching point of the memory module socket to the first memory module via a first branch and to the second memory module via a second branch, wherein the branching is external to the PCB, and wherein
the first branch extends from the branching point at an angle $\theta_1$ with respect to the base end, where 90 degrees≤$\theta_1$<180 degrees; and
the second branch extending from the branching point at an angle $\theta_2$ with respect to the base end, where 90 degrees≤$\theta_2$<180 degrees,
wherein the memory module socket substantially forms a Y-shape between the base end and the first branch and the second branch.

11. The method of claim 10, wherein
the signaling between the PCB and the first memory module is via a first connection trace connecting the first memory module at the first branch to the PCB, and
the signaling between the PCB and the second memory module is via a second connection trace connecting the second memory module at the second branch to the PCB, wherein the first connection trace and the second connection trace are of substantially a same length.

12. The method of claim 11, wherein the first branch and the second branch are straight and have no bending points.

13. The method of claim 11, wherein one of the first branch and the second branch comprises a first leg and a second leg connected at a bending point.

14. The method of claim 13, wherein the first leg extends from the branching point at an angle $\theta_3$ with respect to the base end, where the angle $\theta_3$ is substantially 90 degrees.

15. The method of claim 14, wherein the second leg extends from the bending point at an angle $\theta_4$ with respect to the bending point, where 0 degrees<$\theta_4$≤180 degrees.

16. The method of claim 10, further comprising signaling between a third memory module and the PCB via a second memory module socket, wherein the second memory module socket comprises a second branching point of a different height than the branching point of the memory module socket with respect to the PCB.

17. The method of claim 10, further comprising signaling between the PCB and a third memory module via a third branch of the memory module socket, wherein the third branch extends from the branching point at an angle $\theta_{THIRDBRANCH}$ with respect to the base end, where $\theta_{THIRDBRANCH}$ is substantially 180 degrees.

18. An apparatus, comprising:
a memory module socket comprising:
means for connecting the memory module socket to a printed circuit board (PCB);
means for branching a first branch and a second branch, wherein the means for branching is external to the PCB, and wherein
the first branch extends from the means for branching at an angle $\theta_1$ with respect to the means for connecting the memory module socket, where 90 degrees≤$\theta_1$<180 degrees, and
the second branch extends from the means for branching at an angle $\theta_2$ with respect to the means for connecting the memory module socket, where 90 degrees≤$\theta_2$<180 degrees,
wherein the memory module socket substantially forms a Y-shape between the means for connecting the memory module socket and the first branch and the second branch.

19. The apparatus of claim 18, wherein the first branch is configured to connect to a first memory module, and the second branch is configured to connect to a second memory module.

20. The apparatus of claim 19, wherein the memory module socket comprises a first connection trace configured to connect the first memory module at the first branch to the PCB, and a second connection trace configured to connect the second memory module at the second branch to the PCB, wherein the first connection trace and the second connection trace are substantially a same length.

21. The apparatus of claim 20, wherein the first branch and the second branch are straight.

22. The apparatus of claim 20, wherein one of the first branch and the second branch comprises a first leg and a second leg connected at a bending point.

23. The apparatus of claim 22, wherein the first leg extends from the means for branching at an angle $\theta_3$ with respect to the means for connecting the memory module socket, where the angle $\theta_3$ is substantially 90 degrees.

24. The apparatus of claim 19, further comprising a plurality of the memory module sockets having the means for branching of different heights with respect to the PCB.

25. The apparatus of claim 19, further comprising a third branch configured to connect to a third memory module, wherein the third branch extends from the means for branching at an angle $\theta_{THIRDBRANCH}$ with respect to the means for connecting the memory module socket, where $\theta_{THIRDBRANCH}$ is substantially 180 degrees.

26. An apparatus, comprising:
a memory module socket;
a plurality of memory modules electrically coupled to a printed circuit board (PCB) via a base end of the memory module socket; and
means for conducting signaling to a first one and a second one of the plurality of memory modules, wherein a signal reflection of the first one and a signal reflection of the second one of the plurality of memory modules are substantially the same,
wherein the memory module socket substantially forms a Y-shape between the base end and the first one and the second one of the plurality of memory modules.

27. The apparatus of claim 26, further comprising:
means for providing the signaling to the first one and the second one of the plurality of memory modules via the base end connected to the PCB, wherein the means for providing the signaling drives signaling to the first one and the second one of the plurality of memory modules at substantially a same strength.

28. The apparatus of claim 27, wherein the memory module socket comprises:
means for physically attaching the plurality of memory modules substantially vertical to the PCB.

* * * * *